(12) United States Patent
Kim et al.

(10) Patent No.: US 8,446,093 B2
(45) Date of Patent: May 21, 2013

(54) ORGANIC ELECTRO-LUMINESCENT DISPLAY DEVICE AND MANUFACTURING METHOD THEREOF

(75) Inventors: Ock Hee Kim, Gyeonggi-do (KR); Kang Ju Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 274 days.

(21) Appl. No.: 12/292,100

(22) Filed: Nov. 12, 2008

(65) Prior Publication Data
US 2009/0302744 A1 Dec. 10, 2009

(30) Foreign Application Priority Data
Jun. 4, 2008 (KR) .................. 10-2008-0052757

(51) Int. Cl.
*H05B 33/04* (2006.01)
(52) U.S. Cl.
USPC .............................. 313/512; 313/504; 445/25
(58) Field of Classification Search
USPC .................... 313/504, 512; 445/24, 25
See application file for complete search history.

(56) References Cited

U.S. PATENT DOCUMENTS

| | | | | |
|---|---|---|---|---|
| 6,198,217 | B1 * | 3/2001 | Suzuki et al. | 313/504 |
| 7,781,967 | B2 * | 8/2010 | Hayashi | 313/512 |
| 2003/0071569 | A1 * | 4/2003 | Chung et al. | 313/512 |
| 2003/0164679 | A1 * | 9/2003 | Hamano et al. | 313/504 |
| 2009/0058268 | A1 * | 3/2009 | Yoshida et al. | 313/504 |
| 2010/0110728 | A1 * | 5/2010 | Dubrow et al. | 362/615 |

FOREIGN PATENT DOCUMENTS

| | | |
|---|---|---|
| JP | 2004127661 A | 4/2004 |
| JP | 2004227940 A | 8/2004 |
| KR | 1020050114114 A | 12/2005 |

OTHER PUBLICATIONS

Korean Patent Office Action issued Mar. 24, 2013.

* cited by examiner

*Primary Examiner* — Mary Ellen Bowman
(74) *Attorney, Agent, or Firm* — Morgan, Lewis & Bockius LLP

(57) ABSTRACT

An OLED device and a manufacturing method thereof, which can secure the life span and reliability and can improve light efficiency, is disclosed.
To this end, the device and method disposes organic light emission diode elements on a substrate. On the substrate with the organic light emission diode elements, a sealant layer having a micro-lens portion is disposed, thereby shielding the organic light emission diode elements from external moisture and/or oxygen.

8 Claims, 4 Drawing Sheets

ORGANIC ELECTRO-LUMINESCENT DISPLAY DEVICE AND MANUFACTURING METHOD THEREOF

CROSS-REFERENCE TO RELATED APPLICATION

This application claims priority under 35 U.S.C. 119 to Korean Patent Application No. 10-2008-0052757, filed on Jun. 4, 2008, which is hereby incorporated by reference in its entirety.

BACKGROUND

1. Field of the Disclosure

This disclosure relates to an organic electro-luminescent display device adapted to improve the life span, reliability, and light efficiency of its light emission diodes, and to a manufacturing method thereof.

2. Description of the Related Art

Display devices have been developed along with the development of information communication and have became a modern-day necessity. Of the display devices, organic electro-luminescence display (OLED) devices can be light and slim since they do not need backlight units required for liquid crystal display devices. Also, the OLED devices can be manufactured through a simple process and can have price competitive prices. Moreover, the OLED devices have a low voltage drive, a high luminous efficiency, and a wide viewing angle. In view of these points, the OLED devices have caught more attention as one of next-generation display devices.

The OLED devices fundamentally include an organic light emission diode element consisting of an anode electrode, a cathode electrode, and an organic light emission layer interposed between the anode and cathode electrodes. The organic light emission diode element uses a luminous principle of recombining excitation leptons (or particles) such as free hole and electron. The recombination of the free hole and electron allows them to transit from an instable status to a stable status, thus emit lights. In other words, the organic light emission diode element generates free holes in the anode electrode and free electrons in the cathode electrode so that the free holes and electrons from the anode and cathode electrodes are recombined with each other in the organic light emission layer, thereby emitting lights.

In the OLED device, the lights can radiate above a critical angle. The lights progressing above the critical angle are totally reflected on a boundary surface between a transparent electrode of high refractive index and a substrate of low refractive index. This total reflection substantially leaks the quarter of lights, which are generated in an organic light emission layer, to the exterior. Due to this, the OLED device has a problem in that its optical reproductivity and light efficiency are deteriorated.

Moreover, the deterioration of the light efficiency lowers the brightness of the OLED device. To compensate the lowered brightness, the OLED device requires a higher drive voltage which accelerates more of the deterioration of the organic light emission layer. Due to this, the life span of the OLED device is shortened more.

BRIEF SUMMARY

Accordingly, the present embodiments are directed to an OLED device that substantially obviates one or more of problems due to the limitations and disadvantages of the related art, and a manufacturing method thereof.

An object of the present embodiment is to provide an OLED device that includes a micro-lens portion on a sealant layer to protect organic light emission diodes from external moisture and/or oxygen so as to secure the life span and reliability and to improve light efficiency, and a manufacturing method thereof.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, an OLED device includes: a first electrode disposed on a substrate; an organic light emission layer disposed on the first electrode; a second electrode disposed on the organic light emission layer; and a sealant layer covering the substrate, which has the second electrode, and including a micro-lens portion.

An OLED device according to another aspect of the present embodiment includes: forming a first electrode on a substrate; forming an organic light emission layer on the first electrode; forming a second electrode on the organic light emission layer; and forming a sealant layer with a micro-lens portion on the substrate, which has the second electrode.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
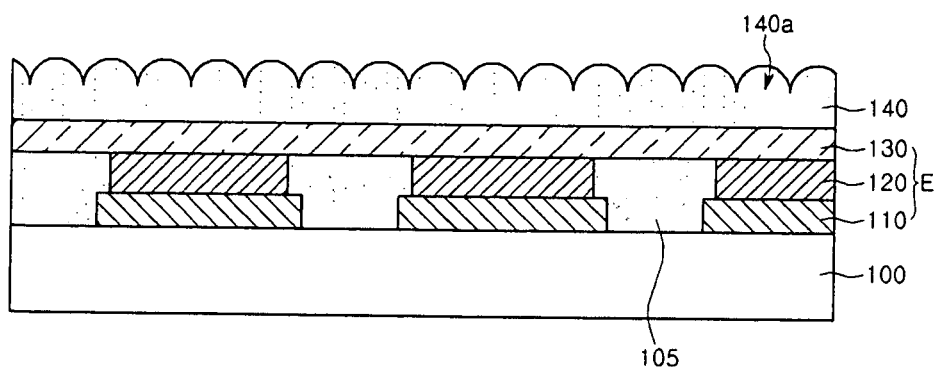
FIG. 1 is a cross sectional view showing an OLED device according to a first embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

FIG. 1 is a cross sectional view showing an OLED device according to a first embodiment of the present disclosure. The OLED device according to the first embodiment of the present disclosure includes a plurality of pixels, but FIG. 1 largely shows only three pixels among the plural pixels displaying an image (or a picture), for the convenience of explanation. Referring to FIG. 1, the LCD device of the first present embodiment includes organic light emission diode elements E, and a sealant layer 140 shielding the organic light emission diode elements E from external oxygen and/or moisture.

Particularly, the substrate 100 includes a plurality of pixels displaying an image (or a picture). Each of the pixels can include red, green, and blue sub-pixels. Also, driver elements applying drive signals to the organic light emission diode elements E are formed the substrate 100, but they are not shown in the drawing and are not described in this disclosure, for the convenience of explanation.

Each pixel on the substrate 100 includes an organic light emission diode element E. The organic light emission diode element E includes first electrode 110, organic light emission layer 120, and second electrode 120 which are sequentially stacked on the substrate 100.

The first electrode 110 is disposed in each pixel. Also, the first electrode 110 includes a conduction material which can reflect lights. For example, the conduction material may be any one among Al, AlNd, Mg, Ag, or others. Alternatively, the first electrode 110 can further include a transparent material such as indium-tin-oxide ITO or indium-zinc-oxide IZO. In other words, the first electrode 110 can be formed in a layered structure of the reflective and transparent materials.

On the substrate 100 with the first electrodes 110, bank pattern 105 further is disposed to partially expose the first electrodes 110. Actually, the bank pattern 105 is formed on the substrate 100 in such a manner as to cover the edge of each first electrode 110. In accordance therewith, the bank pattern 105 defines a substantially luminous portion of each pixel so that it can prevent defects such as a short circuit between the first electrode 110 and the second electrode 130.

The organic light emission layer 120 is disposed on the first electrodes 110 of the luminous portions which are exposed through the bank pattern 105. The organic light emission layer 120 can include red, green, and blue organic light emission layers which are arranged in the respective red, green, and blue pixels. The red, green, and blue organic light emission layers are formed in a variety of manners such as a stripe shape, a dot shape, or others.

The second electrode 130 is disposed on the organic light emission layer 120. Preferably, the second electrode 120 is disposed to cover entirely the plural pixels, as shown in FIG. 1. This second electrode 130 can be formed from a transparent material such as indium-tin-oxide ITO or indium-zinc-oxide IZO. Alternatively, the second electrode 130 can be formed from metal, for example, one among Al, Ag, AlNd, or other, in an enough thin thickness to transmit lights.

Moreover, the organic light emission diode element E can further include at least one of first charge injection and transfer layers between the first electrode 110 and the organic light emission layer 120, in order to improve its light emission efficiency and life span. In addition thereto, the organic light emission diode element E can also include at least one of second charge injection and transfer layers between the organic light emission layer 120 and the second electrode 130.

Such an organic light emission diode element E disposed on the substrate 100 may be of a top emission type because the lights are emitted to the exterior through its upper surface, i.e., the second electrode 130. The organic light emission diode element E of the top emission type can have an aperture ratio larger that the one of bottom emission type which emits lights through the substrate 100.

The sealant layer 140 is disposed over the substrate 100, to cover the organic light emission diode elements E. This sealant layer 140 shields the organic light emission diode elements E from the external moisture and oxygen, so that it can prevent the oxidation and deterioration of the organic light emission diode element E, that is, the organic light emission layer 120, caused by at least one of the moisture and oxygen. In accordance therewith, the life span and reliability of the OLED device are improved. Moreover, the sealant layer 140 allows the OLED device to be manufactured with a thinner thickness than the one of the related art which includes a seal substrate, because it is a thin film.

Also, the sealant layer 140 includes a micro-lens portion 140a converging the lights in an upward direction. Accordingly, the lights emitted from the organic light emission diode element E are converged in the upward direction (i.e., in a front direction) by progressing through the micro-lens portion 140a, thereby further improving the light efficiency. To this end, the micro-lens portion 140a has a shape of plural convexes or embossers which protrude from the surface of the sealant layer 140. In addition, since the micro-lens portion 140a is unified with the sealant layer 140, an independent process of manufacturing the micro-lens portion 140a is unnecessary.

Such a sealant layer 140 unified with the micro-lens portions 140a can protect the organic light emission diode elements E from moisture and oxygen while simultaneously improving the light efficiency of the OLED device.

The sealant layer 140 can be easily formed from an organic material, which can causes out-gases, such as an organic solvent. The out-gases damage the organic light emission diode elements E, thereby reducing the life span of the OLED device as well as polluting working environment.

To address these disadvantages, the sealant layer 140 is formed from a composition that includes a liquid pre-polymer such as polyethylene glycol, hexanediol acrylate, glycidyl acrylate, 1 and 4-butanediol glycidyl ether, and so on. The sealant layer 140 formed from the liquid pre-polymer does not require the use of organic solvents. In accordance therewith, the out-gases generated upon the formation of the sealant layer 140 are minimized, thereby preventing the damages of the organic light emission diode elements E and the pollution of the working environment. In addition thereto, the composition further can include at least one of a cross-linker, an initiator, and a bonding promoter.

In this manner, the OLED device of the first present embodiment, including the sealant layer with the micro-lens portion that is formed through a film formation process, reduces its thickness, in comparison with the one of the related art, which combines a substrate and a seal substrate by means of a seal member, i.e., through the known sealing process. Also, the OLED device of the first present embodiment converges the lights by means of the micro-lens portion, thereby improving its light efficiency. Furthermore, since the sealant layer is formed from a liquid pre-polymer, the OLED device minimizes the generation of out-gases during the formation process of the sealant layer, so that the damage to the organic light emission diode elements can be reduced and the pollution of working environment can be also prevented.

Figure 2:
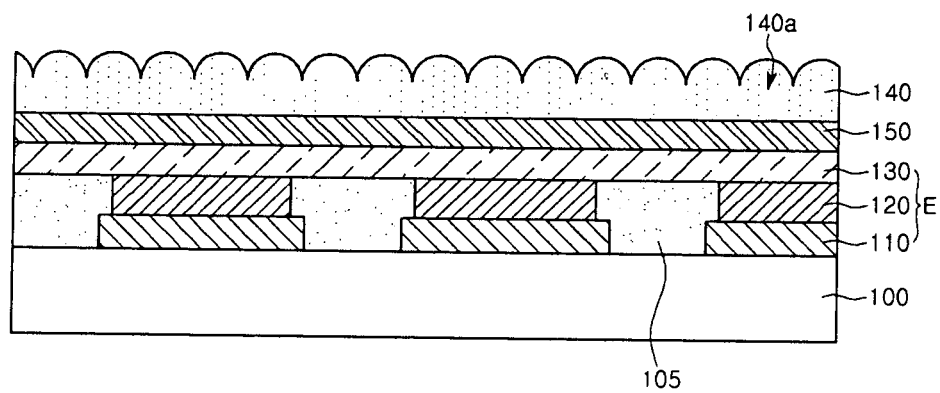
FIG. 2 is a cross sectional view showing an OLED device according to a second embodiment of the present disclosure.

FIG. 2 is a cross sectional view showing an OLED device according to a second embodiment of the present disclosure. The OLED device according to the second embodiment has the same structure as that of the first embodiment described above, with the exception of an auxiliary sealant layer. Accordingly, the description of the first embodiment to be repeated in the second embodiment of the present disclosure will be omitted. Also, the OLED device according to the second embodiment of the present disclosure will refer to the same reference numbers for the same elements as that according to the first embodiment.

Referring to FIG. 2, the OLED device of the second embodiment includes: organic light emission diode elements E arranged on a substrate 100; and a sealant layer 140 disposed on the substrate 100 to cover the organic light emission diode elements E. Each of the organic light emission diode elements E includes; a first electrode 110, an organic light emission layer 120 disposed on the first electrode 110, and a second electrode 130 disposed on the organic light emission layer 120.

The sealant layer 140 protects the organic light emission diode elements E from moisture and/or oxygen. Also, the sealant layer 140 includes a micro-lens portion 140a converging lights from the organic light emission diode elements E in an upward direction. Accordingly, the OLED device of the second embodiment can improve its life span and light efficiency by means of the sealant layer 140.

The sealant layer 140 can have a high permeable index as it is formed from an organic material. Due to this, the sealant layer 140 can not completely shield any one of moisture and the oxygen.

To reinforce the sealing power of the sealant layer 140, an auxiliary sealant layer is interposed between the organic light emission diode elements E and the sealant layer 140. The auxiliary sealant layer 150 may be an inorganic layer that has a permeable index lower than the one of the organic layer. For example, the auxiliary sealant layer 150 can be one of a silicon oxide film and a silicon nitride, or a stacked layer thereof. The auxiliary sealant layer 150 reinforcing the sealing power should prevent the defects of the organic light emission diode elements E that are caused in the process of forming the sealant layer 140.

The auxiliary sealant layer 150 in the second present embodiment is described to be interposed between the organic light emission diode elements E and the sealant layer 140, but it is not limited to this. For example, another auxiliary sealant layer can be disposed on the sealant layer 140.

In this manner, the LED device of the second present embodiment, which further includes the auxiliary sealant layer, can reinforce the power of sealing the organic light emission diode elements E, and can improve more of the life span.

Figure 3:
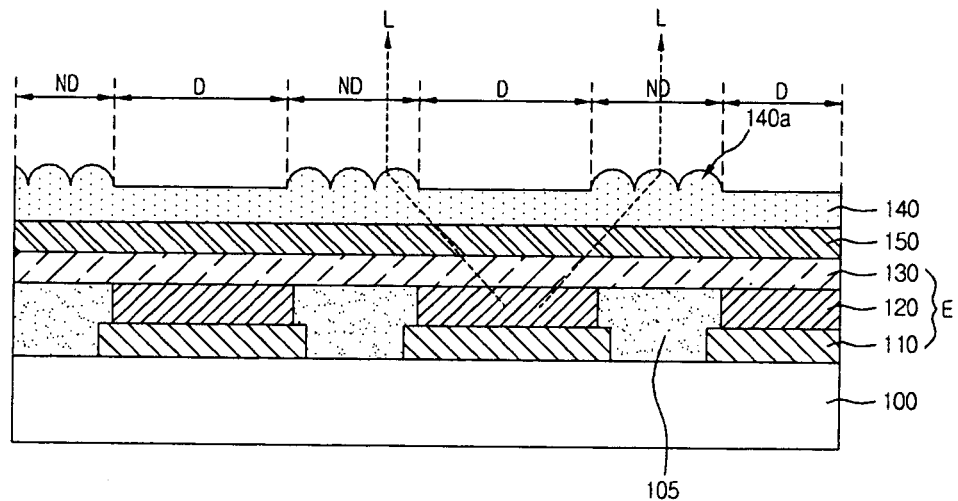
FIG. 3 is a cross sectional view showing an OLED device according to a third embodiment of the present disclosure.

FIG. 3 is a cross sectional view showing an OLED device according to a third embodiment of the present disclosure. The OLED device according to the third embodiment has the same structure as that of the second embodiment described above, with the exception of a micro-lens portion. Accordingly, the description of the second embodiment to be repeated in the third embodiment of the present disclosure will be omitted. Also, the OLED device according to the third embodiment of the present disclosure will refer to the same reference numbers for the same elements as that according to the second embodiment.

Referring to FIG. 3, the OLED device of the second embodiment includes: organic light emission diode elements E arranged on a substrate 100; and a sealant layer 140 disposed on the substrate 100 to cover the organic light emission diode elements E.

The sealant layer 140 includes a micro-lens portion 140a, thereby improving the light efficiency and protecting the organic light emission diode elements E from the moisture and oxygen.

The substrate 100 is defined into emission regions D, in which pixels emitting lights are disposed, and a non-emission region ND which is disposed around but is not the light emission. A first electrode 110, an organic light emission layer 120, and a second electrode 130 are stacked on each emission region D of the substrate 100, in order to emit lights for the image display (or the picture display).

Although not shown in the drawing, several wirings and driver elements for driving the organic light emission diode elements E are arranged on the non-emission region ND. The non-emission region ND can be overlapped around and the edges of the pixels. Moreover, buffer pattern 105 is disposed to prevent defects such as a short circuit between the first electrode 110 and the second electrode 130.

From the emission regions D in which each pixel is disposed, the lights are emitted upwardly, thereby providing the image (or picture). Some lights L generated in each emission region D are emitted in a fixed inclination to the exterior. These lights of the fixed inclination progress through the non-emission regions ND and are joined with the lights of the adjacent emission regions. Due to this, colors different from each other can be mixed. In other words, a blurring phenomenon can be caused.

To address this problem, the micro-lens portion 140a can be disposed on the non-emission region ND. The micro-lens portion 140a converges the lights of the fixed inclination from the adjacent emission regions D and prevents the lights of the fixed inclination from entering into the adjacent emission regions D. Accordingly, the blurring phenomenon due to the mixture of the different color lights may be not caused.

In this way, the OLED device of the third present embodiment disposes the micro-lens portion on the non-emission region so that it can prevent the blurring phenomenon.

Figure 4:
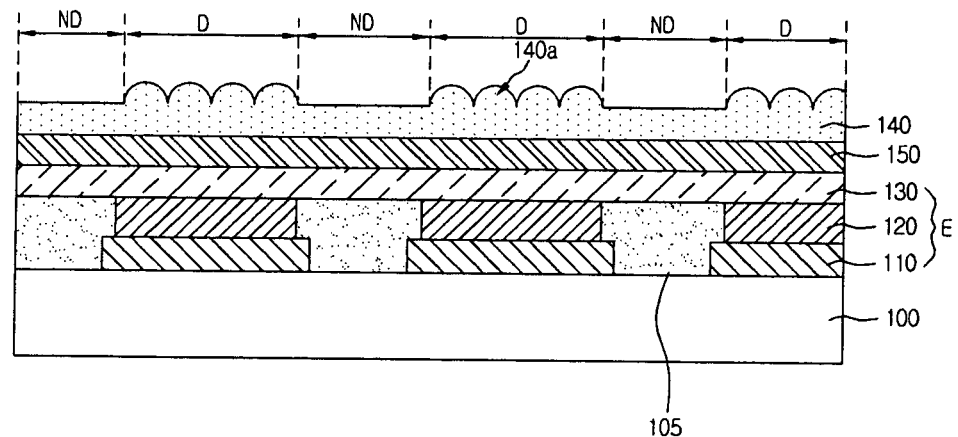
FIG. 4 is a cross sectional view showing an OLED device according to a fourth embodiment of the present disclosure.

FIG. 4 is a cross sectional view showing an OLED device according to a fourth embodiment of the present disclosure. The OLED device according to the fourth embodiment has the same structure as that of the second embodiment described above, with the exception of a micro-lens portion. Accordingly, the description of the second embodiment to be repeated in the fourth embodiment of the present disclosure will be omitted. Also, the OLED device according to the fourth embodiment of the present disclosure will refer to the same reference numbers for the same elements as that according to the second embodiment.

Referring to FIG. 4, the OLED device of the second embodiment includes: organic light emission diode elements E arranged on a substrate 100; and a sealant layer 140 disposed on the substrate 100 to cover the organic light emission diode elements E.

The substrate 100 is defined into display regions D, in which pixels emitting lights are disposed, and a non-display region ND which is disposed around and is not the light emission.

The sealant layer 140 includes micro-lens portions 140a for improving the light efficiency of the respective organic light emission diode elements E. The micro-lens portions 140a are arranged in opposition to the display regions D, and converge the lights emitted there in the upward direction. Accordingly, the light amount being emitted through the display region D increases more in comparison with the one through the non-display region ND. As a result, the blurring phenomenon can be prevented, and the light efficiency can also be improved.

In this manner, the OLED device of the fourth present embodiment disposes the micro-lens portions in the emission regions, so that it can corrects picture defects such as the blurring phenomenon and can improve the light efficiency.

FIGS. 5 to 8 are cross sectional views explaining an OLED device manufacturing method according to a fifth embodiment of the present disclosure. This manufacturing method of the fifth embodiment will be applied only to the OLED device of the second embodiment, but ordinary skilled persons can easily make the OLED devices of the first, third, and fourth embodiments through the disclosure described below.

Figure 5:
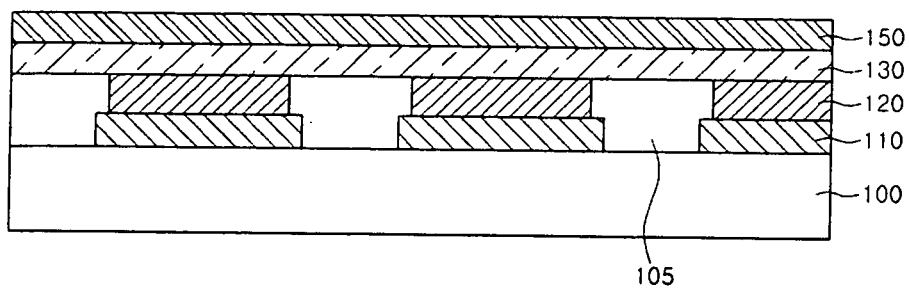
FIGS. 5 to 8 are cross sectional views explaining a manufacturing method of OLED device according to a fifth embodiment of the present disclosure.

Referring to FIG. 5, first electrodes 110 are firstly formed on a substrate 100, in order to manufacture an OLED device. The substrate 100 is defined into a plurality of pixel. The substrate 100 may be of plastic or glass.

For the formation of the first electrode 110, a conduction film is formed on the substrate 100 before forming a fixed photo resist pattern thereon. The conduction film may be a reflection film or a double layer of reflection and transparence films. This conduction film can be formed through a film formation process such as a sputtering process. Sequentially, the conduction film is partially etched by using the photo resist pattern as an etching mask before the photo resist pattern is removed, thereby forming the first electrodes 110 which are arranged on the substrate 100.

On the substrate 100 with the first electrodes 110, a bank pattern 105 is formed. The bank pattern 105 defines an emission region of each pixel. This bank pattern 105 is formed through the process of providing an insulation film and then etching the insulation film. The material forming the insulation film may be one of an acryl-based resin, a urethane resin, a polyimide-based resin, a silicone-based resin, and so on. The insulation film may be formed by one of a spin coating process, a spray process, doctor blade process, and so on.

After forming the bank pattern 105, an organic light emission layer 120 is formed the emission region of each first electrode 110 at least. The organic light emission layer 120 includes organic light emission molecules capable of emitting primary color lights in accordance with the pixels. This organic light emission layer 120 can be formed through a deposition process of using a shadow mask or an ink-jet printing process.

A second electrode 130 is formed on the substrate 100 including the organic light emission layer 120. The second electrode 130 is applied to every pixel as a common electrode. This second electrode 130 may be formed from a light penetration material, for example, indium-tin-oxide ITO or indium-zinc-oxide IZO. Alternatively, the second electrode 130 can be formed from one of Al, Ag, AlNd, and so on, thinly enough to penetrate the lights.

Additionally, at least one of first electric-charge injection or transfer layers can be formed between the first electrode 110 and the organic light emission layer 120. Also, at least one of second electric-charge injection and transfer layers can be further formed between the organic light emission layer 120 and the second electrode 130.

In this way, organic light emission diode elements E can be formed on the substrate 100.

Next, an auxiliary sealant layer 150 can be formed on the organic light emission diode elements E. The auxiliary sealant layer 150 may include an inorganic material that is smaller than an organic material in the permeable index. For example, the auxiliary sealant layer 150 may be a single film of silicon oxide or silicon nitride, or a double layer of a silicon oxide film and a silicon nitride film. This auxiliary sealant layer 150 may be formed through a chemical vapor deposition process.

Figure 6:
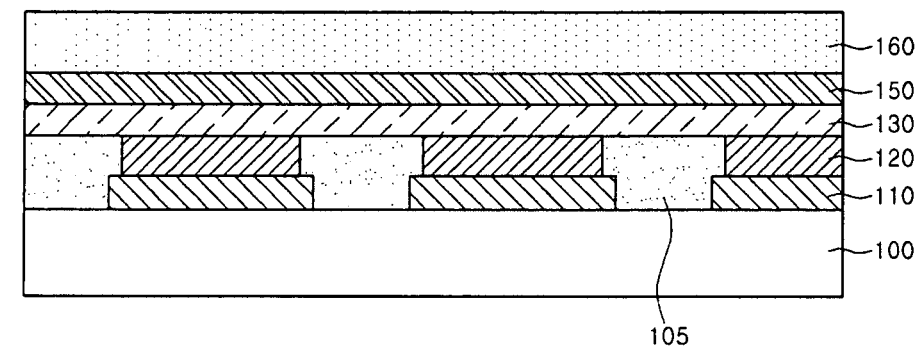

Referring to FIG. 6, a composition including a liquid pre-polymer is coated on the auxiliary sealant layer 150. As the liquid pre-polymer, polyethylene glycol, hexanediol acrylate, glycidyl acrylate, 1 and 4-butanediol glycidyl ether, and so on can be used. Moreover, the composition can further include at least one of a cross-linker, an initiator, and a bonding promoter, as an additive.

The cross-linker cross-links the liquid pre-polymers each other so that the permeable index of the sealant layer 140 can be improved. To this end, the cross-linker may be a material that includes organic function radicals capable of reacting with the liquid pre-polymers. Actually, the cross-linker may include one of aryl methacrylate, trimethyol propane, triacrylate, divinyl benzene, butanediol diacrylate, tri-arylcyanurate, tri-arylisocyanurate and divinyl benzene, butylenes glycol diacrylate, and so on.

The initiator causes the liquid pre-polymers to polymerize each other. The initiator may be one selected from a group that includes an a-hydroxy ketone group compound, a a-amino ketone group compound, a phenyl glyoxylate group compound, an acyl phosphine oxide group compound, a benzo phenone, irgacure 369, 500, 651, and 907 (manufactured by Ciba company).

The bonding promoter improves the power of bonding the sealant layer 140 and the auxiliary sealant layer 150 therebelow. To this end, the bonding promoter can be formed from a material capable of inducing a chemical combination between the sealant layer 140 and the auxiliary sealant layer 150. For example, the bonding promoter may be one among epoxy group compounds and urethane group compounds, such as diepoxy octane, epoxy hexane, and so on.

In this manner, the composition for the sealant layer 140 does not include any organic solvent that generates out-gases.

On such a composition, a soft mold 300 having an intaglio of micro-lens shape is disposed.

Figure 7:
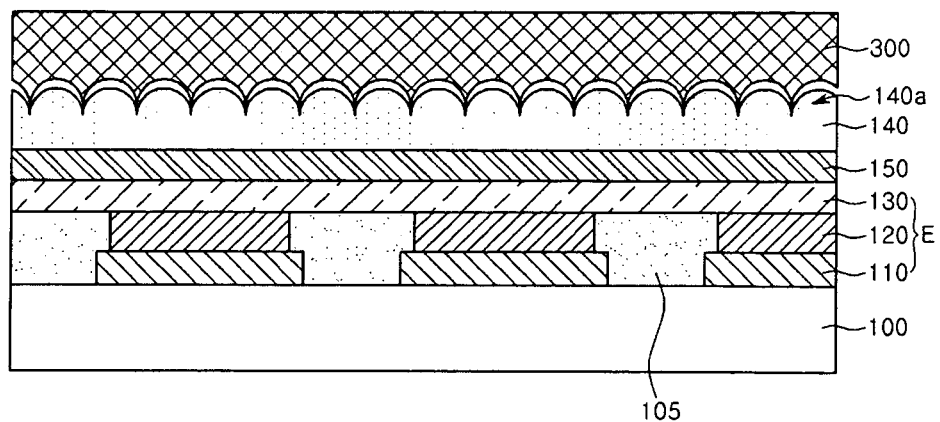
Figure 8:
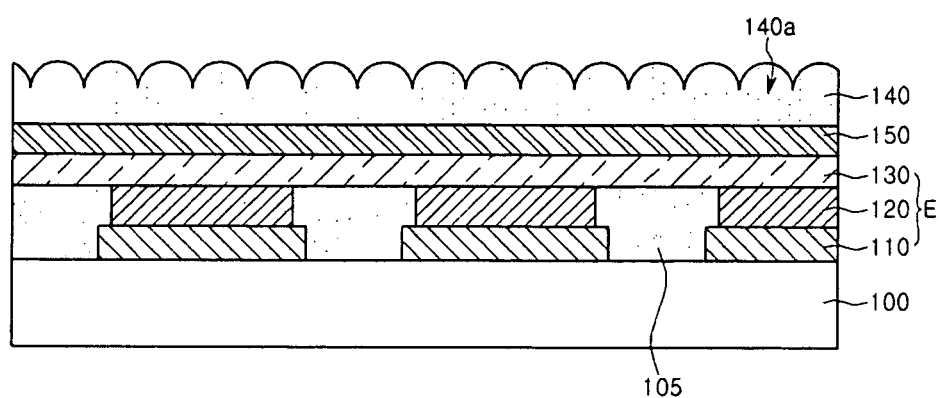

As shown in FIG. 7, the soft mold is depressed closely to the coated composition so that its micro-lens shape is transcribed to the coated composition, thereby forming a preliminary sealant layer. The preliminary sealant layer is hardened in the state that the soft mold is closed thereto. In accordance therewith, the sealant layer is provided with the micro-lens portion 140a. The hardening of the preliminary sealant layer is performed through a heat curing process or a light irradiating process. Then, the soft mold is removed from the sealant layer 140 so that the sealant layer 140 having the micro-lens portion 140 can be formed as shown in FIG. 8.

The micro-lens portion 140a of the sealant layer 140 is variedly changed in its shape and location, through a modification of intaglio in the soft mold. For example, the micro-lens portion 140a is formed to be opposed to any one of the emission and non-emission regions, in order to prevent the blurring defect.

In this way, the OLED device manufacturing method of the present embodiment forms the sealant layer out of a material including the liquid pre-polymers, so that the out-gases accelerating the deterioration of the organic light emission diode elements E can be scarcely generated. Also, since the micro-lens portion is easily formed by using the soft mold, the productivity of the manufacturing process can be improved. Furthermore, the sealant layer formation process using the soft mold can be cut down the material costs, in comparison with a photo process of providing a thin film and then etching the thin film.

As described above, the OLED devices according to the embodiments of the present disclosure includes the sealant layer for shielding the organic light emission diode element from external moisture and oxygen, instead of independently provided sealing substrate and member. Therefore, the thickness of the OLED device is reduced and simultaneously the process efficiency of the OLED device is improved.

Also, the OLED devices of the present embodiments can improve their light efficiency because of the micro-lens portion provided in the sealant layer.

Moreover, the sealant layer formed of the liquid pre-polymers can minimize the out-gases generated during its formation process, thereby reducing the defects of the organic light emission diode elements and simultaneously improving the working environment.

Furthermore, as the micro-lens portion of the sealant layer is easily formed by using the soft mold, this can cut down the material costs in comparison with the photo process of the related art, and can reduce more of the process errors such as a misalignment, than the attaching process of a micro-lens sheet according to the related art.

It will be apparent to those skilled in the art that various modifications and variations can be made in the present disclosure. Thus, it is intended that the present disclosure cover the modifications and variations of this embodiment provided they come within the scope of the appended claims and their equivalents.

What is claimed is:

1. An organic electro-luminescent display device, comprising:
    a substrate including emission regions and non-emission regions;
    a first electrode disposed on an emission region, among the emission regions, of the substrate;
    an organic light emission layer disposed on the first electrode;
    a second electrode disposed on the organic light emission layer and a non-emission region, among the non-emission regions, of the substrate; and
    a sealant layer covering an entire region of the second electrode,
    wherein the sealant layer has top and bottom surfaces opposite to each other,
    wherein the top surface includes first flattening surfaces corresponding to the emission regions of the substrate, respectively,
    wherein micro-lens surfaces corresponding to the non-emission regions of the substrate, and disposed between the first flattening surfaces, are unified with and protrude from the first flattening surface,
    wherein the bottom surface includes a second flattening surface in an entire region thereof, and
    wherein a first thickness between the first flattening surface of the top surface and the second flattening surface of the bottom surface is smaller than a second thickness between the micro-lens surface of the top surface and the second flattening surface of the bottom surface.

2. The organic electro-luminescent display device claimed as claim 1, further comprising an auxiliary sealant layer of inorganic material interposed between the second electrode and the sealant layer.

3. A method of manufacturing an organic electro-luminescent display device, the method comprising:
    preparing a substrate including emission regions and non-emission regions;
    forming a first electrode on an emission region, among the emission regions, of the substrate;
    forming an organic light emission layer on the first electrode;
    forming a second electrode on the organic light emission layer and a non-emission region, among the non-emission regions, of the substrate; and
    forming a sealant layer covering an entire region of the second electrode,
    wherein the sealant layer has top and bottom surfaces opposite each other,
    wherein the top surface includes first flattening surfaces corresponding to the emission regions of the substrate, respectively,
    wherein micro-lens surfaces corresponding to the non-emission region of the substrate, and disposed between the first flattening surfaces, are unified with and protrude from the first flattening surface,
    wherein the bottom surface includes a second flattening surface in an entire region thereof, and
    wherein a first thickness between the first flattening surface of the top surface and the second flattening surface of the bottom surface is smaller than a second thickness between the micro-lens surface of the top surface and the second flattening surface of the bottom surface.

4. The method claimed as claim 3, wherein the forming of the sealant layer includes:
    coating a composition, which includes liquid pre-polymers, on the second electrode;
    closely depressing the composition with a soft mold, to form a preliminary sealant layer;
    hardening the preliminary sealant layer to form the sealant layer; and
    removing the soft mold from the sealant layer.

5. The method claimed as claim 4, further comprising forming an auxiliary sealant layer through a deposition of inorganic material before coating the composition.

6. The organic electro-luminescent display device claimed as claim 1, wherein the liquid pre-polymer includes at least one of polyethylene glycol, hexanediol acrylate, glycidyl acrylate, and 1, 4-butanediol glycidyl ether.

7. The organic electro-luminescent display device claimed as claim 1, wherein the composition further includes at least one of a cross-linker, an initiator, and a bonding promoter.

8. The organic electro-luminescent display device claimed as claim 1, wherein the composition does not include an organic solvent.

* * * * *